United States Patent [19]

Megumi et al.

[11] 4,001,127

[45] Jan. 4, 1977

[54] PROCESS OF PREPARING SINGLE CRYSTALS OF STRONTIUM BARIUM NIOBATE

[75] Inventors: Kouiti Megumi; Kazuyuki Nagatsuma; Yasutoshi Kashiwada; Yoshio Furuhata, all of Kokubunji, Japan

[73] Assignee: Agency of Industrial Science and Technology, Tokyo, Japan

[22] Filed: July 22, 1974

[21] Appl. No.: 490,677

[30] Foreign Application Priority Data

July 25, 1973   Japan .............................. 48-83043

[52] U.S. Cl. .............................. 252/62.9; 423/593; 156/617 SP; 156/DIG. 78; 23/304; 23/305 R
[51] Int. Cl.$^2$ ......................................... B01J 17/18
[58] Field of Search ............... 252/62.9; 23/301 SP, 23/304, 305 RE; 423/593; 156/617 SP, 624, DIG. 78

[56] References Cited

UNITED STATES PATENTS 3,647,697   3/1972   Ballman et al. .................. 252/62.9

OTHER PUBLICATIONS

Ballman et al. I "Chem. Abstracts", vol. 68, 1968, p. 24848n.
Brice et al. "Chem. Abstracts", vol. 75, 1971 p. 54378w.
Katsutoshi et al. "Chem. Abstracts", vol. 79, 1973 p. 24517f.

*Primary Examiner*—Jack Cooper
*Attorney, Agent, or Firm*—Charles E. Pfund

[57] ABSTRACT

In a process of preparing single crystals of strontium barium niobate of the type wherein melt of a mixture of strontium oxide, barium oxide and niobium pentoxide is prepared and a single crystal of strontium barium niobate is grown from the melt by using a seed crystal, the compositions included in region A or B shown in FIGS. 2 and 3 are used as the ternary compositions of strontium oxide, barium oxide and niobium pentoxide in the melt.

4 Claims, 4 Drawing Figures

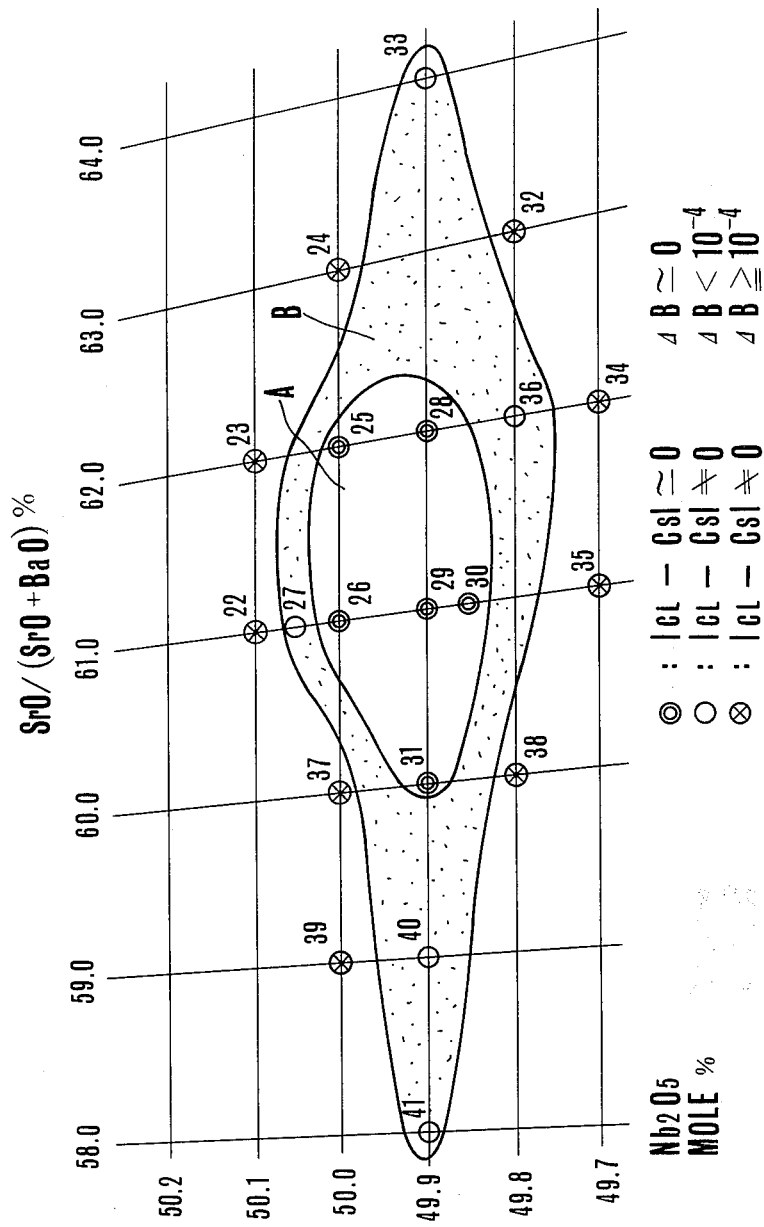

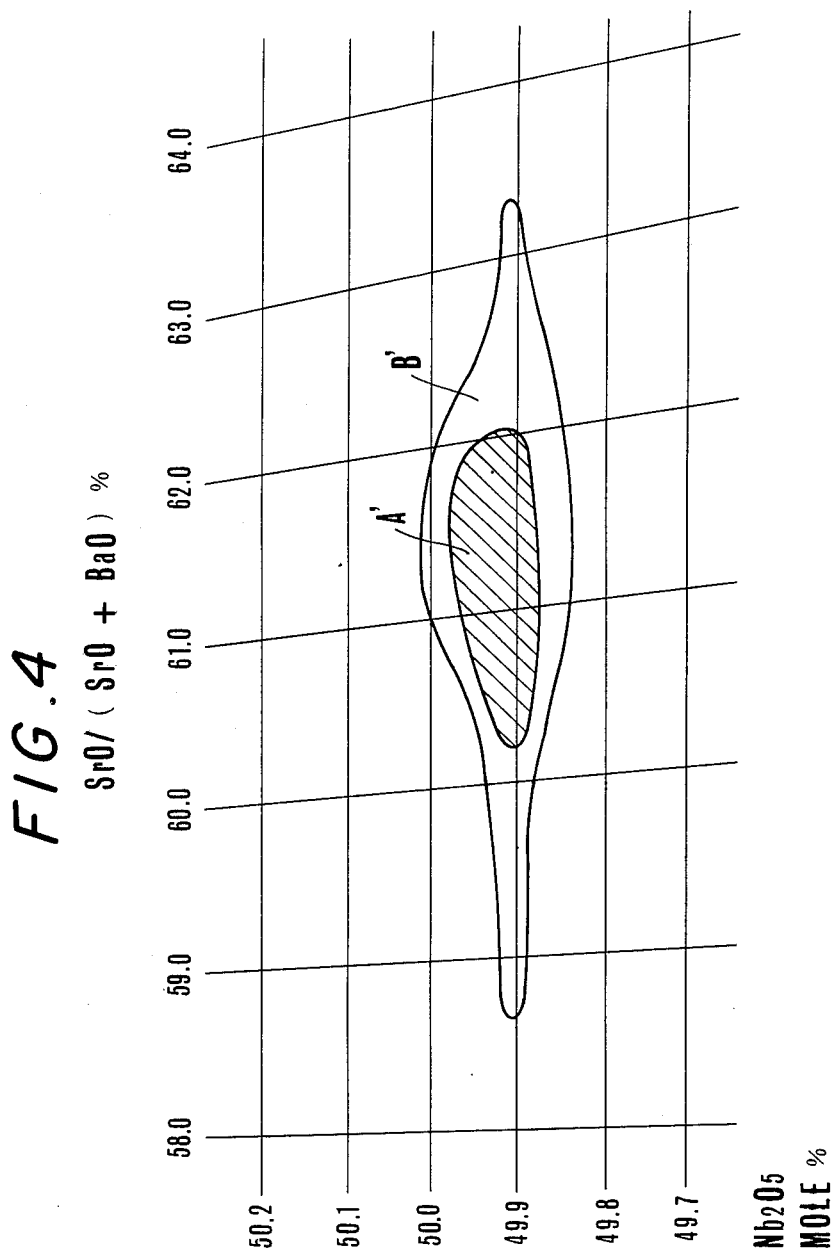

PROCESS OF PREPARING SINGLE CRYSTALS OF STRONTIUM BARIUM NIOBATE

BACKGROUND OF THE INVENTION

This invention relates to a method of preparing single crystals of ferroelectric strontium barium niobate (hereinafter abbreviated as SBN).

As is well known in the art, SBN is a ferro-electric substance having a tungsten bronze structure, that is an opto-electronic substance characterized by an extremely large linear electro-optic coefficient, an extremely smaller half wave voltage than any known material, a maximum pyroelectric coefficient among known substances, and extremely large nonlinear polarizability for photoelectric constant and second harmonic generation. Owing to these excellent characteristics application of this material to make various optical devices and elements has been excepted greatly but practical use has not been succeeded because it has been impossible to obtain single crystals of this substance having excellent optical quality.

Single crystals of SBN prepared by prior art methods have optical defects such as cores and growth striae mainly caused by the variation in the composition. These defects greatly impair the homogeneity of the crystals, thus decreasing the extinction ratio. These defects are caused mainly by the difficulty of preparing homogenous solid solution crystals.

SBN is a solid solution consisting of three components of strontium oxide (Sr O), barium oxide (Ba O) and niobium pentoxide ($Nb_2O_5$) and has a fairly wide solid solution area. As will be described hereinafter, when preparing solid solution crystals from a melt, it is essential to select a melt having a composition that is close to a congruently melting composition in order to always obtain single crystals having excellent optical characteristics.

The congruently melting composition has already been reported in publications, for example, J. R. Carruthess and M. Grasso "Phase Equilibria Relations in the Ternary System $BaO\text{-}SrO\text{-}Nb_2O_5$", J. Electrochem., Vol. 117 (1970), pp 1426–1430. Single crystals prepared in accordance with the values reported in this reference not only have the optical defects described above but also difficult to always prepare products of desired characteristics. This means that the reported value does not correspond to a true congruently melting composition so that it is essential to determine the true value in order to prepare crystals of excellent quality.

SUMMARY OF THE INVENTION

The phase diagram of a solid solution is generally shown by FIG. 1 of the accompanying drawing. (Although SBN is a ternary solid solution, for the sake of simplifying, of method of describing a binary system is used.) A point $a$ at which a liquidus and a solidus merge together corresponds to a congruently melting point and a point $C_o$ represents a congruently melting composition.

At a non-congruently melting point $b$ the composition $C_{S1}$ of the grown crystal is substantially different from the composition $C_{L1}$ of a melt and assumes a value given by an equation.

$$C_{S1} = k\, C_{L1} \qquad 1$$

where $k$ represents an effective distribution coefficient which is a function of the crystal growth rate F as shown by the following equation.

$$k = \frac{k_o}{k_o + (1 - k_o)\exp\left(-F \cdot \frac{\delta}{D}\right)} \qquad 2$$

where $k_o$ represents an equilibrium distribution coefficient, $\delta$ the thickness of a diffusion boundary layer, and $D$ a diffusion coefficient. The solidus shown in FIG. 1 corresponds to the equilibrium state expressed by a relation $F=0$. The composition of the crystal on this line is designated by $C_{S1}^{\,o}$ which is of course different from the composition $C_{S1}^{\,F}$ of the crystal growing under a non-equilibrium state.

Thermal or mechanical fluctuation results in the variation in the composition causing an optical inhomogeneity in the direction of pulling up the crystal, which is called a growth stria, as well as an optical inhomogeneity in the direction normal to the direction of pulling up the crystal, which is called a core. Assume now that the temperature $T_L$ of the melt is caused to vary by $\Delta T$ under the influence of a turbulence or the like, the temperature gradient $dT_L/dz$ of the melt at the liquid-solid interface will vary by $\Delta T/\delta_T$ thus causing the ratio of crystalization to vary in accordance with a relation $$\Delta F = \frac{K_L}{\delta_T H_f} \cdot$$

$\Delta T$ where $K_L$ represents the thermal conductivity of the melt, $\delta_T$ the thickness of the thermal boundary layer, and $H_f$ the latent heat of solidification. As the rate of crystallization varies the composition of the crystal $C_s$ will vary by $$\Delta C_s = \frac{(dC_s)}{dF} \Delta F$$

according to equation 2 thus causing the natural birefringence $\delta ns$ to vary by $$\Delta \delta ns = \frac{d(\delta ns)}{d\, C_s} \Delta C_s.$$

In the case wherein the pull-up speed and the number of revolutions of the crystal vary, similar variations are encountered, although causing direct variations in the crystal growth rate F, thereby causing the growth striae and cores.

In the case of a non-congruently melting composition, as the solid-liquid interface has a concentration gradient a constitutional super cooling occurs when the temperature gradient at the interface is small or the rate of solidification is high. Accordingly, it becomes difficult to prevent creation of an inhomogeneous distribution of the crystal composition regardless of any method of controlling external conditions.

Moreover, in the case of non-congruently melting composition, even when the thermal and mechanical variations are perfectly suppressed, a gradual variation in the composition in the direction of pulling up the crystal is unavoidable where the amount of the grown crystal is not negligible with respect to the amount of the initial melt. This is caused by the fact that, at point $b$ shown in FIG. 1, the composition of the melt shifts in the direction opposite to the side of the congruently melting composition ($C_{L1} \rightarrow C_{L2}$) because of the growth of the crystals having a composition closer to the congruently melting composition than that of the melt, and that the composition of the crystals gradually shifts from $C_{S1}$ to $C_{S2}$ with the variation in the melting temperature. Owing to these phenomena, the refractive index of the crystals will have a gradient in the direction of pulling up the crystal and a chemical stress caused by the difference in the coefficient of expansion will be applied onto the crystals thus introducing macroscopic defects such as cracks or grain boundaries as well as microscopic defects such as dislocations.

On the other hand, at the point of a congruently melting composition, as compositions of the melt and of the crystals are always equal there is no fear of resulting in the variation in the composition caused by temperature variations or mechanical oscillations or variations in the composition at the upper and lower ends of a long crystal. Thus, it would be possible to prepare optically homogeneous single crystals.

For the reason described above, in the manufacture of solid solution crystals such as SBN from their melt it is important to select a composition of the melt close to the congruently melting composition in order to prepare crystals of an excellent quality.

We have now succeeded to determine the desired congruently melting composition by a series of experiments in which single crystals were formed from melt having various compositions, the compositions of the resulting single crystals were analyzed and the analyzed compositions were compared with those of the starting melt. As a consequence, we have found a range of compositions which gives single crystals having qualities of practical utility.

Accordingly, an object of this invention is to provide a novel process of preparing valuable SBN single crystals by using melt having a congruently melting composition or compositions close thereto.

Another object of this invention is to provide a process of preparing SBN single crystals having an optical quality suitable for use in electro-optical field.

Still another object of this invention is to provide a novel process capable of preparing SBN single crystals at a high reproduceability.

A further object of this invention is to obtain SBN single crystals having a natural birefringence gradient smaller than $1 \times 10^{-4}$/cm.

According to this invention, these and other objects can be accomplished by providing a process of preparing single crystals of strontium barium niobate of the type wherein melt of a mixture of strontium oxide, barium oxide and niobium pentoxide is prepared and a single crystal is grown from the melt by using a seed crystal, characterized in that the compositions included in the region A or B shown in FIGS. 2 and 3 of the accompanying drawings are used as the ternary compositions of strontium oxide, barium oxide and niobium pentoxide in the melt.

According to another aspect of this invention there is provided a strontium barium niobate single crystal having a ternary composition of strontium oxide, barium oxide and niobium pentoxide included in region A' or B' shown in FIG. 4 of the accompanying drawings.

According to still another aspect of this invention there is provided a strontium barium niobate single crystal having a local gradient of birefringence of smaller than $1 \times 10^{-4}$/cm.

The single crystals of this invention have more excellent optical characteristics than prior art strontium barium niobate single crystals and can be prepared at high reproduceabilities.

BRIEF DESCRIPTION OF THE DRAWINGS

Further objects and advantages of the invention can be more fully understood from the following detailed description taken in conjunction with the accompanying drawings in which:

FIGS. 2 and 3 are phase diagrams showing ternary compositions of $S_rO - BaO - Nb_2O_5$ of the melt utilized in the embodiments of this invention and;

FIG. 4 is a phase diagram of $S_rO - BaO - Nb_2O_5$ ternary compositions comprising the SBN single crystals prepared by the process of this invention.

DESCRIPTION OF THE PREFERRED EMBODIMENTS

Figure 1:
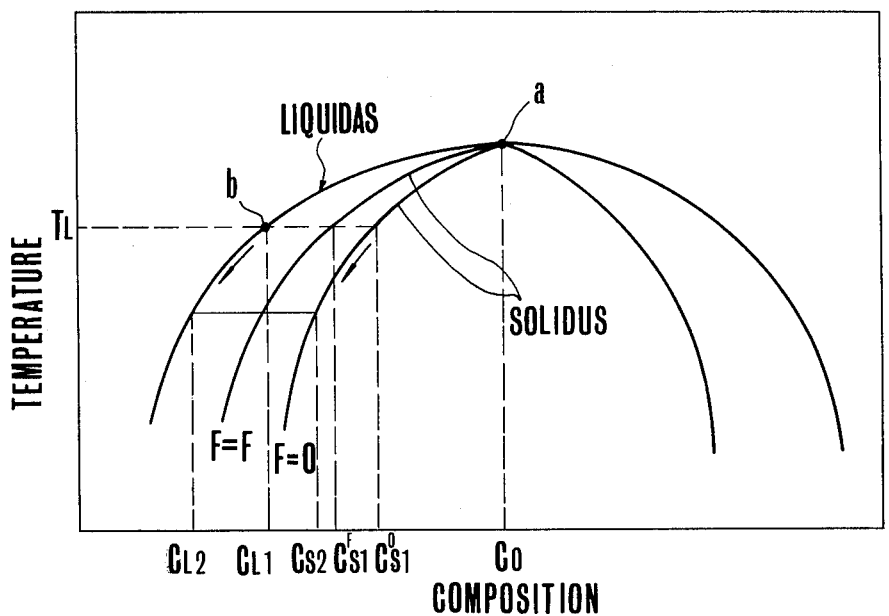
FIG. 1 shows a typical phase diagram of a solid solution.

Respective parts (in mole %) shown in Table 1 of the raw material powders of strontium carbonate ($SrCO_3$), barium carbonate ($BaCO_3$) and niobium pentoxide ($Nb_2O_5$) having a purity of over 99.99%, were weighed at an accuracy of $10^{-4}$, and were admixed by means of an agitator. The resulting mixtures were press moulded and the press moulded pieces were sintered for 2 hours at a temperature of 1400° C.

Table 1

| Example Number | Composition of Melt (mole %) | | | Composition of Crystals (mole %) | | |
|---|---|---|---|---|---|---|
| | SrO | BaO | $Nb_2O_5$ | SrO | BaO | $Nb_2O_5$ |
| 1 | 19.20 | 28.80 | 52.00 | 21.25 | 27.95 | 50.80 |
| 2 | 19.60 | 29.40 | 51.00 | 21.44 | 28.54 | 50.02 |
| 3 | 20.00 | 30.00 | 50.00 | 21.48 | 28.59 | 49.93 |
| 4 | 20.40 | 30.60 | 49.00 | 21.36 | 29.14 | 49.50 |
| 5 | 20.80 | 31.20 | 48.00 | 21.49 | 29.21 | 49.30 |
| 6 | 23.00 | 27.00 | 50.00 | 23.83 | 26.45 | 49.72 |
| 7 | 24.00 | 24.00 | 52.00 | 25.51 | 23.55 | 50.94 |
| 8 | 24.50 | 24.50 | 51.00 | 25.90 | 24.10 | 50.00 |
| 9 | 25.00 | 25.00 | 50.00 | 25.87 | 24.43 | 49.70 |
| 10 | 25.50 | 25.50 | 49.00 | 25.95 | 24.55 | 49.50 |
| 11 | 26.00 | 26.00 | 48.00 | 26.21 | 24.58 | 49.21 |
| 12 | 28.80 | 19.20 | 52.00 | 30.13 | 19.27 | 50.60 |
| 13 | 29.40 | 19.60 | 51.00 | 30.33 | 19.55 | 50.12 |
| 14 | 30.00 | 20.00 | 50.00 | 30.18 | 19.87 | 49.95 |
| 15 | 30.60 | 20.40 | 49.00 | 30.57 | 19.54 | 49.89 |
| 16 | 31.20 | 20.80 | 48.00 | 30.95 | 19.95 | 49.10 |
| 17 | 33.60 | 14.40 | 52.00 | 34.08 | 15.32 | 50.60 |
| 18 | 34.30 | 14.70 | 51.00 | 34.52 | 15.36 | 50.12 |
| 19 | 35.00 | 15.00 | 50.00 | 34.72 | 15.38 | 49.90 |
| 20 | 35.70 | 15.30 | 49.00 | 34.79 | 15.71 | 49.50 |
| 21 | 36.40 | 15.60 | 48.00 | 35.00 | 15.80 | 49.20 |
| 22 | 30.44 | 19.46 | 50.10 | 30.48 | 19.51 | 50.01 |
| 23 | 30.94 | 18.96 | 50.10 | 30.90 | 19.07 | 50.03 |
| 24 | 31.50 | 18.50 | 50.00 | 31.33 | 18.72 | 49.95 |
| 25 | 31.00 | 19.00 | 50.00 | 30.92 | 19.11 | 49.97 |
| 26 | 30.50 | 19.50 | 50.00 | 30.51 | 19.50 | 49.99 |
| 27 | 30.47 | 19.48 | 50.05 | 39.49 | 19.49 | 50.02 |
| 28 | 31.06 | 19.04 | 49.90 | 31.06 | 19.05 | 49.89 |
| 29 | 30.56 | 19.54 | 49.90 | 30.56 | 19.54 | 49.90 |
| 30 | 30.59 | 19.56 | 49.85 | 30.60 | 19.57 | 49.87 |
| 31 | 30.06 | 20.04 | 49.90 | 30.70 | 19.39 | 49.91 |
| 32 | 31.63 | 18.57 | 49.80 | 31.42 | 18.69 | 49.89 |
| 33 | 32.06 | 18.04 | 49.90 | 31.71 | 18.38 | 49.91 |
| 34 | 31.19 | 19.11 | 49.70 | 31.12 | 19.06 | 49.82 |
| 35 | 30.68 | 19.62 | 49.70 | 30.64 | 19.56 | 49.80 |
| 36 | 31.12 | 19.08 | 49.80 | 31.07 | 19.06 | 49.87 |
| 37 | 30.00 | 20.00 | 50.00 | 30.19 | 19.88 | 49.93 |
| 38 | 30.12 | 20.08 | 49.80 | 30.10 | 20.02 | 49.88 |
| 39 | 29.50 | 20.50 | 50.00 | 29.72 | 20.32 | 49.96 |
| 40 | 29.56 | 20.54 | 49.90 | 29.71 | 20.39 | 49.90 |
| 41 | 29.06 | 21.04 | 49.90 | 29.31 | 20.77 | 49.92 |

By this heat treatment, ceramics of SBN were formed through the following chemical reaction

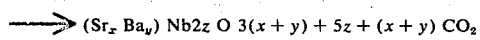

where $x$, $y$ and $z$ show the ratio of admixing raw materials in terms of molar fractions and $x + y + 3 = 1$.

After confirming that the respective ceramics have definite compositions and structures (tetragonal tungsten bronz type structure) by means of X-ray fluorescence analysis and X-ray powder method, respectively, each ceramic was charged in a platinum crucible and melted. Then a single crystal having a weight of about 10% of that of the melt was formed by Czochralski method wherein a seed crystal is immersed in the melt and is then pulled up at a low speed.

At this time, for the purpose of preventing inhomogeneity of the crystal caused by the constitutional super cooling and the variation in the distribution coefficient, the temperature variation of the melt was limited to be less than 1° C at the maximum, and a small pull-up speed of 2mm/hr was selected. The number of revolutions of the crystal was 60 r.p.m. and the C-axis of the crystal was selected as the pull-up direction. The atmosphere used was air.

Instead of carbonates, nitrides can also be used as the raw material powders. Further, when preparing the melt, instead of first sintering the mixture of raw material powders, in certain cases, it is possible to directly charge the mixture of the raw materials into the crucible and then to slowly heat the crucible to form the melt.

The upper end of each single crystal prepared in this manner was cut off, and the cut off end was pulverized to form a fine powder having a particle size of less than 300 mesh. The powder was used as a measuring sample and the composition analysis was made on three elements of niobium, barium and strontium by X-ray fluorescence analysis. The results of the analysis are shown in Table 1.

Figure 2:
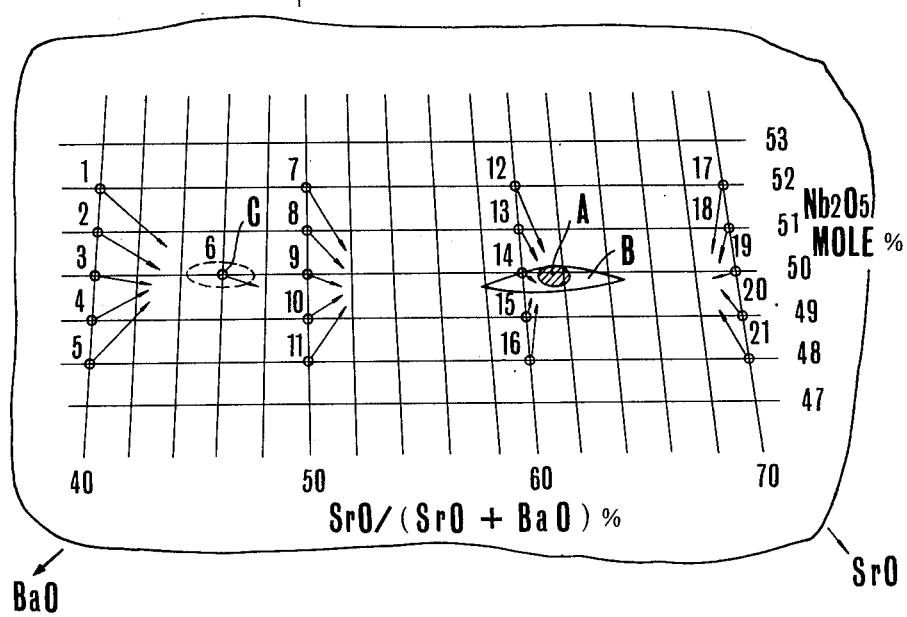

The ternary composition phase diagram shown in FIG. 2 was plotted by combining the compositions of the melt and those of the single crystals prepared therefrom. The phase diagram shown in FIG. 2 is plotted in terms of $SrO/(SrO + BaO)$ % and $Nb_2O_5$ mole %. The origins of the arrows show the compositions of the melt whereas the heads of the arrows the compositions of the single crystals prepared therefrom, and these arrows correspond to $C_{L1} \rightarrow C_{L2}$ shown in FIG. 1.

FIG. 3 is an enlarged view of the righthand portion of FIG. 2. In FIGS. 2 and 3 region A shows a range in which any difference in the compositions of the melt and of the single crystal is not detectable, so that correct congruently melting compositions lie in this region. Point C shows the value of the congruently melting composition which was reported previously. The compositions of the single crystals prepared from the melt with this composition greatly differ from those of the melt proving that the previous reported value is not correct.

FIG. 4 is a phase diagram of the compositions of the single crystals prepared by the process of this invention. Regions A' and B' show the compositions of the single crystals prepared from the melt having compositions shown in regions A and B, respectively, shown in FIG. 3.

Crystal plates which are respectively perpendicular to and parallel with the direction of pulling up the crystal were cut from crystals of respective compositions and their surfaces were subjected to optical polishing. Thereafter, the presence or absence of macroscopic defects such as cracks and small angle grain boundaries as well as optical defects such as growth striae and cores was examined by shaded projection method. Further, each crystal plate was loaded in a Twyman-Green interferometer to determine the gradient of the local natural birefringence $\Delta B (= \Delta \delta_{ns}/\Delta x)$ from the observed spacings of fringes. The following Table 2 shows the maximum value of $\Delta B$ of the single crystals prepared from the melt having compositions close to the congruently melting compositions of SBN.

Table 2

Birefringence Gradients of single crystals

| Example Number | Composition of melt (mole %) | | | $\Delta B \times 10^{-4}$ cm |
|---|---|---|---|---|
| | SrO | BaO | $Nb_2O_5$ | |
| 22 | 30.44 | 19.46 | 50.10 | 1.2 |
| 23 | 30.94 | 18.96 | 50.10 | 1.8 |
| 24 | 31.50 | 18.50 | 50.00 | 1.2 |
| 25 | 31.00 | 19.00 | 50.00 | 0 |
| 26 | 30.50 | 19.50 | 50.00 | 0 |
| 27 | 30.47 | 19.48 | 50.05 | 0.3 |
| 28 | 31.06 | 19.04 | 49.90 | 0 |
| 29 | 30.56 | 19.54 | 49.90 | 0 |
| 30 | 30.59 | 19.56 | 49.85 | 0 |
| 31 | 30.06 | 20.04 | 49.90 | 0 |
| 32 | 31.63 | 18.57 | 49.80 | 2.1 |
| 33 | 32.06 | 18.04 | 49.90 | 0.8 |
| 34 | 31.19 | 19.11 | 49.70 | 2.7 |
| 35 | 30.68 | 19.62 | 49.70 | 1.9 |
| 36 | 31.12 | 19.08 | 49.80 | 0.7 |
| 37 | 30.00 | 20.00 | 50.00 | 1.4 |
| 38 | 30.12 | 20.08 | 49.80 | 1.1 |
| 39 | 29.50 | 20.50 | 50.00 | 2.9 |
| 40 | 29.56 | 29.54 | 49.90 | 0.7 |
| 41 | 29.06 | 21.04 | 49.90 | 0.9 |

A practical requirement for an optical crystal for use as a light modulator element and second harmonic generating element is that the local gradient $\Delta B$ of the natural birefringence should satisfy a relation $$\Delta B < 1 \times 10^{-4}/cm.$$

Regions B shown in FIGS. 2 and 3 are the plots of the result of measurements shown in Table 2 showing the range of compositions that satisfy this practical requirement. The points represented by symbols ⊙, ○ and ⊗ have the following meanings.

⊙ : $|C_L - C_S| \cong 0, \Delta B \cong 0$

○ : $|C_L - C_S| \neq 0, \Delta B < 10^{-4}$

⊗ : $|C_L - C_S| \neq 0, \Delta B \quad 10^{-4}$

The reproduceability was tested by repeatedly preparing single crystals from the compositions contained in region B. In each cast, any optical defect such as cores and growth striae was not noted and the variation in the birefringence was small. When the crystal was used as a light modulator element the extinction ratio was higher than 40:1 in each case showing that the crystal can be used in practical applications.

Single crystals prepared from the melt included in the region A shown in FIGS. 2 and 3 had no optical defects such as cores and growth striae and no variation in the natural birefringence. When such crystals were used as light modulator elements a high extinction ratio of 100:1 was obtained.

As described hereinabove, according to this invention melt having compositions included in region A or B are used to prepare SBN single crystals having excellent optical characteristics. Accordingly, such SBN single crystals can be used advantageously as light modulators, electro-optical deflectors, acoustic-optical deflectors, pyroelectric detectors or other optical devices.

While the invention has been described with reference to particular embodiments thereof, it should be understood that numerous modifications will be obvious to one skilled in the art without departing from the true scope and spirit of the invention as defined in the appended claims.

What is claimed is:

1. In a process of preparing single crystals of strontium barium niobate of the type wherein a melt of a mixture of strontium oxide, barium oxide and niobium pentoxide is prepared, said melt having a temperature variation of less than 1° C and a single crystal of strontium barium niobate is grown from said melt by the Czochralski method, wherein a seed crystal is immersed in said melt and pulled therefrom at a speed of 2mm/hour, the improvement wherein the compositions, included in region B shown in FIG. 3 of the accompanying drawings are used as the ternary compositions of strontium oxide, barium oxide and niobium pentoxide in said melt, said single crystals having a composition included in region B' shown in FIG. 4 and a local gradient of birefringence of smaller than $1 \times 10^{-4}$/cm.

2. In a process of preparing single crystals of strontium barium niobate of the type wherein a melt of a mixture of strontium oxide, barium oxide and niobium pentaxide is prepared, said melt having a temperature variation of less than 1° C and a single crystal of strontium barium niobate is grown from said melt by the Czochralski method, wherein a seed crystal is immersed in said melt and pulled therefrom at a speed of 2mm/hr, the improvement wherein the compositions included in region A shown in FIG. 3 of the accompanying drawings are used as the ternary compositions of strontium oxide, barium oxide and niobium pentoxide in said melt, said single crystals having a composition included in region A' of FIG. 4 and a local gradient of birefringence of substantially zero.

3. A strontium barium niobate single crystal having a ternary composition of strontium oxide, barium oxide and niobium pentoxide included in a region B' shown in FIG. 4, wherein said single crystal has a local gradient of birefringence of smaller than $1 \times 10^{-4}$/cm.

4. A strontium barium niobate single crystal having a ternary composition of strontium oxide, barium oxide and niobium pentoxide included in a region A' shown in FIG. 4 wherein said single crystal has a local gradient of birefringence of substantially zero.

* * * * *